United States Patent [19]

Anthony et al.

[11] Patent Number: 5,056,098

[45] Date of Patent: Oct. 8, 1991

[54] VERTICAL CAVITY LASER WITH MIRROR HAVING CONTROLLABLE REFLECTIVITY

[75] Inventors: Philip J. Anthony; Leo M. F. Chirovsky, both of Bridgewater; Lucian A. D'Asaro, Madison; Vincent D. Mattera, Flemington, all of N.J.; Robert A. Morgan, Topton, Pa.

[73] Assignee: AT&T Bell Laboratories, Murray Hill, N.J.

[21] Appl. No.: 548,033

[22] Filed: Jul. 5, 1990

[51] Int. Cl.[5] .............................................. H01S 3/19
[52] U.S. Cl. ...................................... 372/45; 372/46; 372/49
[58] Field of Search ........................ 372/45, 46, 96, 49

[56] References Cited

U.S. PATENT DOCUMENTS 4,873,696 10/1989 Coldren et al. ..................... 372/46
4,943,970 7/1990 Bradley ............................... 372/45
4,949,350 8/1990 Jewell et al. ........................ 372/45

FOREIGN PATENT DOCUMENTS 0046996 2/1989 Japan .................................. 372/45

OTHER PUBLICATIONS

"Optical Engineering", 29, pp. 210–214, Mar. 1990.
"Electronics Letters", 26, pp. 710–711, Mar. 24, 1990.
"Optical Nonlinearities and Instabilities in Semiconductors", pp. 339–346, Academic Press, 1-1988, Miller, Chemla, and Schmitt-Rink.

Primary Examiner—Georgia Epps
Attorney, Agent, or Firm—R. D. Laumann

[57] ABSTRACT

A light emitting device uses a vertical cavity surface emitting laser having a voltage controlled mirror which is used, for example, to turn the laser ON and OFF by varying the reflectivity of one mirror forming the laser cavity.

7 Claims, 1 Drawing Sheet

VERTICAL CAVITY LASER WITH MIRROR HAVING CONTROLLABLE REFLECTIVITY

TECHNICAL FIELD

This invention relates to the field of semiconductor lasers which have a mirror with controllable reflectivity for adjusting the lasing threshold and the intensity of the emitted radiation.

BACKGROUND OF THE INVENTION

Semiconductor lasers have found widespread use in modern technology as the light source of choice in, e.g., communications systems, compact disc players, etc. The typical semiconductor laser is a double heterostructure with a narrow bandgap, high refractive index layer surrounded on opposed major surfaces by wide bandgap, low refractive index layers. The low bandgap layer is termed the "active layer", and the bandgap and refractive index differences serve to confine both charge carriers and optical energy to the active layer or region. Opposite ends of the active layer have mirror facets which form the laser cavity. The cladding layers have opposite conductivity types and when current is passed through the structure, electrons and holes combine in the active layer to generate light.

While perfectly adequate for many applications, the structure described has two drawbacks which are pertinent to this invention. First, the active layer has a longitudinal axis which runs parallel to the major surfaces of the structure and substrate and the light is emitted in a direction generally parallel to the longitudinal axis; i.e., the structure is an edge emitting device. However, for many purposes, it is desirable that light be emitted in a direction perpendicular to the substrate, i.e., that the device be a surface emitting device. For example, surface emitting devices can be fabricated in arrays with relative ease while edge emitting devices can not be so fabricated. Such arrays are potentially useful in such diverse applications as, for example, image processing inter-chip communications, i.e., optical interconnects, etc. Second, the laser is typically turned ON and OFF by varying the current flow through the device. This requires a relatively large change in the current through the device which is undesirable.

Several types of surface emitting lasers have been developed. One such laser of special promise is termed a "vertical cavity surface emitting laser". See, for example, *Optical Engineering*, 29, pp. 210-214, March 1990 for a description of this laser. Also, see *Electronics Letters*, 26 pp. 710-711, Mar. 24, 1990. The laser described has an active region with one or more quantum well layers. The quantum well layers are interleaved with barrier layers. On opposite sides of the active region are mirror stacks which are formed by interleaved semiconductor layers having properties, such that each layer is typically a quarter wavelength thick at the wavelength (in the medium) of interest thereby forming the mirrors for the laser cavity. There are opposite conductivity type regions on opposite sides of the active region, and the laser is turned ON and OFF by varying the current through the active region. Variations, including dielectric and metal mirrors and metal contacts, have been demonstrated.

An array of lasers is fabricated by growing the desired layers on a substrate and then patterning the layers to form the array. Individual lasers may be separately contacted with appropriate contacts. Laser densities in excess of a million lasers per square centimeter can presently be obtained.

However, a technique for turning the laser ON and OFF and for varying the intensity of the emitted radiation from a vertical cavity surface emitting laser which is easily monolithically integrated with the laser would be desirable.

SUMMARY OF THE INVENTION

A laser comprising a vertical cavity surface emitting laser having an active region, first and second mirrors on opposite sides of said active region, at least one of said mirrors on one side of said active region having controllable reflectivity, and a means for injecting carriers into said active region. Means for injecting may comprise first and second regions having first and second conductivity types on opposite sides of said active region. In one embodiment, the active region comprises at least one quantum well with quantum well barrier layers matched in conductivity to the adjacent mirror regions.

In a preferred embodiment, the mirror having controllable reflectivity comprises a region having voltage controlled optical properties. In one embodiment, the optical property is absorption. In a further preferred embodiment, the mirror having controllable reflectivity further comprises at least one quantum well and a region having a first conductivity type on the side of the quantum well away from the active region. The quantum well is in an intrinsic conductivity region which is adjacent to the second conductivity type region of the means for injecting carriers into the active region. The laser thus has regions of first, second, intrinsic, and first conductivity types. In this embodiment, the mirror uses the quantum-confined Stark effect to change the optical absorption of the mirror and thus control the reflectivity of the mirror. The mirror may have its reflectivity controlled either optically or electrically.

For reasons of clarity, the elements depicted are not drawn to scale.

DETAILED DESCRIPTION

Figure 1:
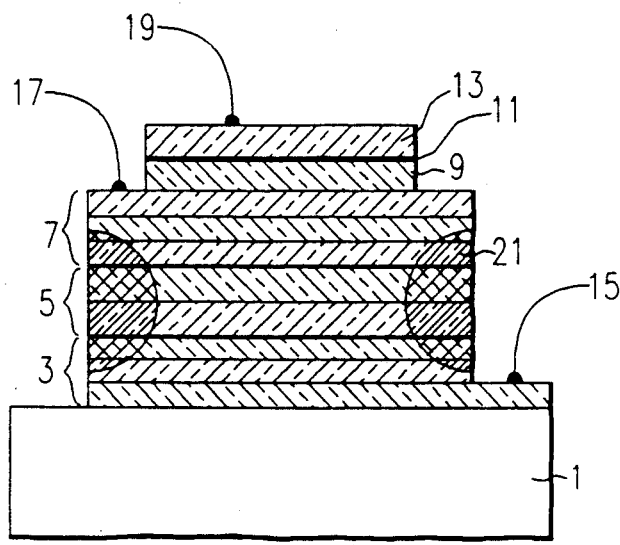
FIG. 1 is a sectional view of a laser according to this invention.

An exemplary embodiment of our invention using a vertical cavity surface emitting laser is depicted in a sectional view in FIG. 1. As will be appreciated by those skilled in the art, some elements which are not essential to an understanding of the invention are either not depicted or described in detail. For example, only a single laser is depicted, although it will be readily appreciated that an array of lasers will typically be present. Depicted are substrate 1, region 3 having a first conductivity type, active region 5, regions 7 and 9 having a second conductivity type, quantum well region 11, and region 13 having a region of first conductivity type. Region 11 has intrinsic conductivity and comprises one or more quantum wells. Regions 3, 7, 9, and 13 comprise mirrors which are depicted as interference mirrors. Region 3 comprises a first mirror. Only several layers are shown for reasons of clarity. At least parts of regions 3 and 7 have first and second conductivity types, respectively. The remaining portions may have conductivity of the same type or have intrinsic conductivity. Appropriate regions of different conductivity types will be readily selected by those skilled in the art. Regions 7, 9, 11, and 13 form a second, distributed mirror with controllable reflectivity. The active region typically comprises one or more quantum well regions which are interleaved with barrier layers, i.e., layers having a bandgap greater than the bandgap of the quantum well region. However, the use of bulk semiconductors is not precluded. There are first, second, and third electrical contacts 15, 17, and 19, to regions 3 and 7, and to layer 13, respectively. Contact 15 may be physically made to substrate 1 if the substrate is conducting and not semi-insulating. Isolation region 21 restricts the area of the current flow through the active region to the area generally under region 13. Isolation region 21 can be formed by, e.g., deep ion implantation. Other forms of current and optical confinement are contemplated. The portions of regions 3 and 7 having first and second conductivity types form means for injecting carriers into the active region. The first interference mirror comprises, and the second interference mirror further comprises, a plurality of interleaved first and second semiconductor layers with each layer having characteristics such that it is typically a quarter wavelength thick at the medium wavelength of interest thereby forming an interference mirror. The individual layers of the active region and the interference mirrors are not individually depicted as those skilled in the art know the structure of these elements.

In an exemplary embodiment, the substrate is semi-insulating GaAs; regions 3, 7, 9, and 13 comprise alternating layers of AlAs and AlGaAs with properties as described in the previous paragraph. The active region comprises between 1 and 4 GaAs quantum wells interleaved with AlGaAs barrier layers. There are MBE grown layers in regions 3 and 7 which are doped with Si and Be to give the regions first and second conductivity types, respectively. Quantum well region 11 is optically coupled to region 7, i.e., the absorption due to the quantum wells is within the distributed mirror. Region 11 has at least one quantum well of GaAs, separated by barrier layers of AlGaAs, and positioned in an intrinsic conductivity region of AlGaAs. Region 13 comprises interference mirror layers of, e.g., AlAs and AlGaAs, and has a first conductivity type. Those skilled in the art will readily select appropriate layer thicknesses and these parameters need not be described in detail. The use of other semiconductors is contemplated and appropriate choices will readily be made by those skilled in the art. For example, other Group III-IV semiconductors may be used.

Conventional and well known epitaxial growth techniques, such as molecular beam epitaxy or metalloorganic chemical vapor deposition, may be used to grow the layers described. After the layers have been grown, conventional patterning techniques are then used to form the individual lasers in the array. Electrical contacts to the individual lasers are also fabricated. Those skilled in the art will readily select appropriate patterning and contacting techniques.

The intensity of the light emitted from the device can be varied by controlling the reflectivity of the mirror.

Figure 2:
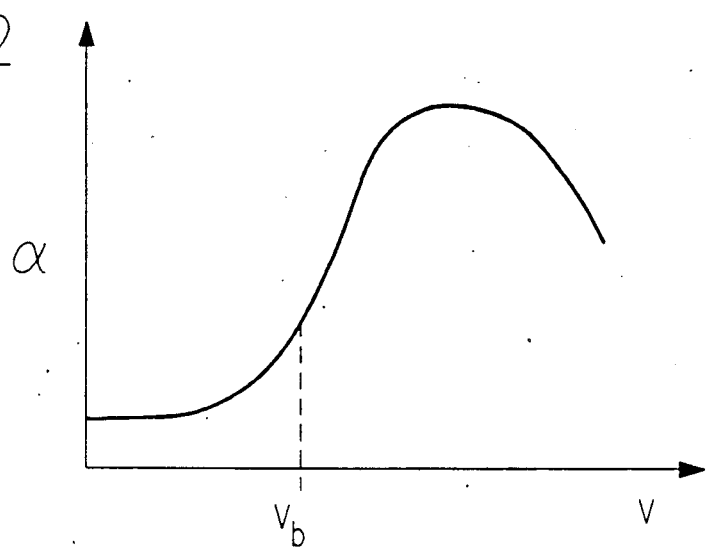
FIG. 2 plots the absorption coefficient vertically versus the voltage horizontally for an exemplary quantum-confined Stark effect region useful in this invention.

An exemplary embodiment using the quantum-confined Stark effect will be described. This effect is now well known and understood by those skilled in the art; the effect is described in a chapter written by Miller, Chemla and Schmitt-Rink in *Optical Nonlinearities and Instabilities in Semiconductors*, pp. 339-347, Academic Press, 1988. Basically, the exciton absorption depends on the magnitude of the electric field in the quantum well. FIG. 2 plots the absorption coefficient of the quantum well region vertically versus the applied voltage horizontally for a wavelength longer than that of the zero field exciton. It will be readily appreciated that the voltage is between contacts 19 and 17, i.e., a reverse bias p-i-n junction, and that an increasing voltage corresponds to an increasing electric field and vice versa. Arbitrary units are used for purposes of exposition. The initial voltage is $V_b$ and it will be assumed that the laser is OFF at that voltage. As can be seen, the absorption coefficient can be varied a significant amount with a relatively small change in the voltage.

Figure 3:
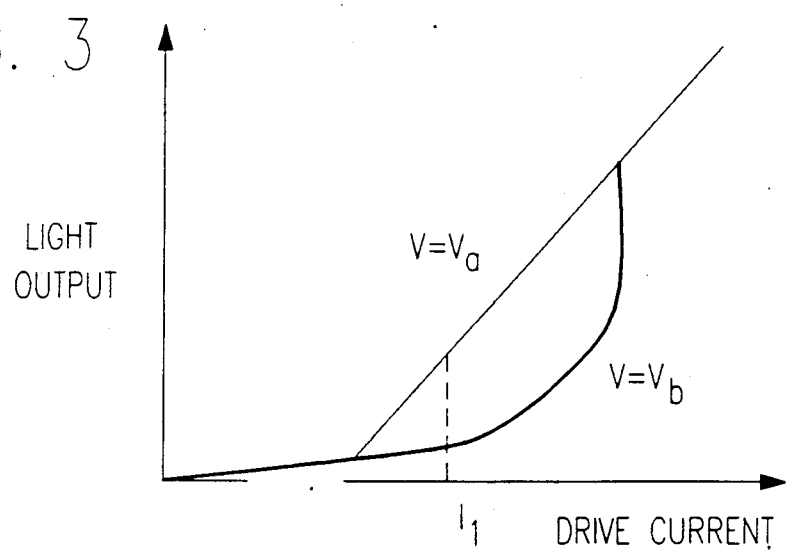
FIG. 3 plots the light output versus the drive current for two different reflectivity conditions produced by two voltage levels.

This property is used in our laser as follows. A vertical cavity surface emitting laser needs relatively large reflectivities in both mirror stacks for lasing; typically, mirror stack reflectivities should be 99 percent or greater. The quantum well region functions as a bias dependent mirror and, by appropriately varying the bias, the laser can be turned ON and OFF as the value off the absorption is shifted. For example, assume the laser if OFF at $V_b$ with drive current $I_1$. Reducing the voltage to zero reduces the absorption and thereby restores the reflectivity of the mirror stack. The laser then turns ON, with light output appropriate for the low absorption, high reflectivity state. This is shown in FIG. 3 as $V = V_a$. As will be readily appreciated, the quantum well region should have minimal absorption when the laser is ON for efficient operation of the laser. The quantum well region is, as previously described, desirably incorporated into an intrinsic conductivity region which forms part of a reverse bias p-i-n structure. A small voltage change is needed to vary the reflectivity of the mirror. However, the magnitude of the current supplied through contacts 15 and 17 remain essentially constant as the laser is turned ON and OFF. This simplifies the design of the power supply (not shown) for the array and minimizes any problems that might otherwise arise due to the varying heat generated in the vertical cavity laser array, to the varying carrier density in the active region, and to the resulting index changes in the optical cavity.

The optical spatial field distribution of the surface emitting laser and the position of the quantum well absorber are both engineering parameters. More or less absorption can be obtained by placing the absorber near a node or antinode, respectively. More or less absorption can also be obtained by increasing or decreasing the reflectivity of region 7, thereby coupling relatively less or more of the quantum well absorption into the distributed mirror. Additionally, the design and number of the quantum wells can be varied from that described. Those skilled in the art will readily select appropriate parameters.

The laser may be used in a self latching mode. After the laser is turned ON at some drive current, the intensity of the optical field may be sufficiently great in the quantum well absorber so that the quantum well absorber is bleached, i.e., saturated, even when the bias is returned to $V_b$. The precise behavior will depend upon the absorption coefficient and the laser power as well as other parameters. In general terms, the explanation is a follows. Before lasing occurs at an appropriate laser drive current, the absorption in the quantum well region is high and the cavity Q is spoiled. The bias is now reduced to zero volts and the gain in the vertical cavity exceeds the loss and the laser turns ON. The high optical intensity saturates the absorber and the bias will likely have to be increased to, e.g., $2 V_b$, to turn the laser OFF as $V_b$ will no longer suffice.

Variations of the embodiment described are contemplated. For example, the controllable mirror may use any voltage controllable effect. The light may be emitted throughh either the substrate or the top mirror. It will also be understood that the term, "vertical," is used to mean perpendicular to the major surfaces of the substrate. The means for rejecting can have first and second conductivity types on opposite sides of the active region, either along the axis formed by the first mirror, active region and second mirror, or along some other axis.

We claim:

1. A laser comprising a vertical cavity surface emitting laser having an active region;
first and second mirrors on opposite sides of said active region, at least one of said mirrors having controllable reflectivity, said at least one of said mirrors having an electrically controlled reflectivity; and means for injecting carriers into said active region.

2. A laser as recited in claim 1 in which said means for injecting comprises first and second regions having first and second conductivity types on opposite sides of said active region.

3. A laser as recited in claim 2 in which said mirror having controllable reflectivity further comprises at least one quantum well and a region having a first conductivity type, said region of second conductivity type being between said regions of first conductivity types.

4. A laser as recited in claim 3 further comprising an intrinsic conductivity region, said at least one quantum well being in said region.

5. A laser as recited in claim 1 in which at least one of said mirrors comprises a region having voltage controlled optical properties.

6. A laser as recited in claim 2 in which at least one of said mirrors comprises an interference mirror.

7. A laser as recited in claim 1 in which said active region comprises at least one quantum well.

* * * * *